(12) United States Patent
Hieda et al.

(10) Patent No.: US 10,461,611 B2
(45) Date of Patent: Oct. 29, 2019

(54) ELECTROMECHANICAL MOTOR UNIT

(71) Applicant: JTEKT CORPORATION, Osaka-shi, Osaka (JP)

(72) Inventors: Takahito Hieda, Kashihara (JP); Kouya Yoshida, Okazaki (JP); Naoki Tani, Kashiwara (JP)

(73) Assignee: JTEKT CORPORATION, Osaka-shi (JP)

( * ) Notice: Subject to any disclaimer, the term of this patent is extended or adjusted under 35 U.S.C. 154(b) by 357 days.

(21) Appl. No.: 15/622,263

(22) Filed: Jun. 14, 2017

(65) Prior Publication Data

US 2017/0366073 A1   Dec. 21, 2017

(30) Foreign Application Priority Data

Jun. 21, 2016   (JP) ................................. 2016-122758

(51) Int. Cl.
| | | |
|---|---|---|
| *H02K 11/33* | (2016.01) | |
| *H02K 9/22* | (2006.01) | |
| *H02M 7/00* | (2006.01) | |
| *H01L 23/367* | (2006.01) | |

(52) U.S. Cl.
CPC .............. *H02K 11/33* (2016.01); *H02K 9/22* (2013.01); *H02M 7/003* (2013.01); *H01L 23/3675* (2013.01)

(58) Field of Classification Search
CPC ........ H02K 11/33; H02K 11/30; H02K 11/04; H02K 11/05; H02K 9/22; H02K 5/18; H02M 7/003
USPC .......................................... 310/68 D, 72, 71
See application file for complete search history.

(56) References Cited

U.S. PATENT DOCUMENTS

| | | | |
|---|---|---|---|
| 5,801,330 A | 9/1998 | Gademann et al. | |
| 6,411,507 B1 | 6/2002 | Akram | |
| 9,479,025 B2 * | 10/2016 | Kawata | ................. H02K 11/20 |
| 10,047,826 B2 * | 8/2018 | Moore | ..................... F16H 1/10 |
| 10,050,493 B2 * | 8/2018 | Kabune | ................. H02K 11/33 |

(Continued)

FOREIGN PATENT DOCUMENTS

| | | |
|---|---|---|
| EP | 2 818 705 A1 | 12/2014 |
| JP | 2008 141903 A | 6/2008 |
| JP | 2014-75866 A | 4/2014 |

OTHER PUBLICATIONS

Oct. 11, 2017 Search Report issued in European Patent Application No. 17176546.4.

*Primary Examiner* — Jeremy A Luks
(74) *Attorney, Agent, or Firm* — Oliff PLC

(57) ABSTRACT

In a driving unit of an electromechanical motor unit, a semiconductor chip and a smoothing capacitor are joined to a second main surface of a substrate having a first main surface and the second main surface. The semiconductor chip includes a first end portion facing the second main surface, and a second end portion on the opposite side of the semiconductor chip from the first end portion. The smoothing capacitor includes a third end portion facing the second main surface, and a fourth end portion on the opposite side of the smoothing capacitor from the third end portion. The semiconductor chip is thermally connected to a bottom wall portion of a cover member, at a position closer to the second main surface than the fourth end portion is. The bottom wall portion is thermally connected to the motor housing via a sidewall portion of the cover member.

12 Claims, 4 Drawing Sheets

(56) References Cited

U.S. PATENT DOCUMENTS

| | | | |
|---|---|---|---|
| 10,128,720 B2 * | 11/2018 | Ishizeki | H02K 11/04 |
| 10,145,450 B2 * | 12/2018 | Moore | F16H 1/10 |
| 10,160,478 B2 * | 12/2018 | Hayashi | H02K 15/028 |
| 2011/0285223 A1 | 11/2011 | Miyachi et al. | |
| 2013/0033823 A1 | 2/2013 | Nagashima et al. | |
| 2015/0257309 A1 | 9/2015 | Bass | |

* cited by examiner

ELECTROMECHANICAL MOTOR UNIT

INCORPORATION BY REFERENCE

The disclosure of Japanese Patent Application No. 2016-122758 filed on Jun. 21, 2016 including the specification, drawings and abstract, is incorporated herein by reference in its entirety.

BACKGROUND OF THE INVENTION

1. Field of the Invention

The invention relates to an electromechanical motor unit including a motor and a driving unit that includes a driving circuit configured to execute drive control of the motor.

2. Description of the Related Art

In an electromechanical motor unit including a motor and a driving unit that includes a driving circuit configured to execute drive control of the motor, a semiconductor chip including switching devices is usually provided in the driving circuit. Thus, a surge voltage may be generated during switching operations of the switching devices. The magnitude of a surge voltage is proportional to the inductance component of a current path, such as a conductive trace, through Which a current flows. Therefore, how to remove the inductance component from the current path is one of the issues to be addressed.

Examples of a method of removing the inductance component from the current path include a method in which, among electronic components constituting the driving circuit, the semiconductor chip and a smoothing capacitor configured to smooth the voltage to be applied to the semiconductor chip is joined to the same surface of the same substrate. With such a configuration, the current path between the semiconductor chip and the smoothing capacitor is shortened, and thus the inductance component therebetween can be reduced. An example of such a configuration is illustrated in FIG. 2 of Japanese Patent Application Publication No. 2014-75866 (JP 2014-75866 A).

FIG. 2 of JP 2014-75866 A illustrates an electric power steering system including a motor and a driving unit including a driving circuit configured to execute drive control of the motor. The electric power steering system includes the motor including a motor housing. The driving unit including a power substrate (a substrate) disposed so as to face the motor housing in the axial direction of the motor is provided outside the motor housing. The switching devices (the semiconductor chip) and the smoothing capacitor that constitute a part of the driving circuit are joined to a surface of the power substrate, which is on the opposite side of the power substrate from the motor housing, so as to be adjacent to each other via a heat sink. A case (a cover member) configured to accommodate the power substrate is attached to the motor housing such that the case is apart from the switching devices and the smoothing capacitor.

How to suppress an increase in the temperature in the driving unit is another issue to be addressed regarding an electromechanical motor unit. A main source of heat generation in the driving unit is a semiconductor chip including switching devices. In the configuration illustrated in FIG. 2 of JP 2014-75866 A, the cover member configured to accommodate the substrate is provided so as to be apart from the semiconductor chip and the smoothing capacitor in the axial direction. Thus, the heat generated in the semiconductor chip cannot be smoothly transferred to the cover member. For this reason, the heat generated in the semiconductor chip cannot be efficiently transferred to the motor housing having a relatively large thermal capacity via the cover member. As a result, the temperature in the driving unit may increase.

SUMMARY OF THE INVENTION

One object of the invention is to provide an electromechanical motor unit configured to suppress an increase in the temperature in the driving unit.

An aspect of the invention relates to an electromechanical motor unit including a motor and a motor control device. The motor includes a motor housing made of metal. The motor control device is disposed outside the motor housing so as to face the motor in an axial direction of the motor. The motor control device includes a driving unit including a driving circuit configured to execute drive control of the motor, and a cover member made of metal and configured to accommodate the driving unit. The driving unit includes a substrate, a semiconductor chip, and a smoothing capacitor. The substrate has a first main surface facing the motor housing, and a second main surface that is on the opposite side of the substrate from the first main surface. The semiconductor chip is joined to the second main surface of the substrate. The semiconductor chip includes a switching device constituting a part of the driving circuit. The semiconductor chip has a first end portion facing the second main surface of the substrate in the axial direction, and a second end portion that is on the opposite side of the semiconductor chip from the first end portion. The smoothing capacitor is joined to the second main surface of the substrate. The smoothing capacitor constitutes a part of the driving circuit. The smoothing capacitor is configured to smooth a voltage to be applied to the semiconductor chip. The smoothing capacitor has a third end portion facing the second main surface of the substrate in the axial direction, and a fourth end portion that is on the opposite side of the smoothing capacitor from the third end portion. The fourth end portion is at a position further away, in the axial direction, from the second main surface of the substrate than the second end portion of the semiconductor chip is. The cover member includes a facing wall, and a connection portion. The facing wall is disposed so as to face the second main surface of the substrate in the axial direction and so as to face the smoothing capacitor in a direction perpendicular to the axial direction. The facing wall is thermally connected to the semiconductor chip, at a position between the third end portion and the fourth end portion of the smoothing capacitor in the axial direction. The connection portion is disposed outward of a peripheral edge of the substrate as viewed in the axial direction. The connection portion extends from a peripheral edge of the facing wall toward the motor housing. The connection portion thermally connects the facing wall and the motor housing to each other.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
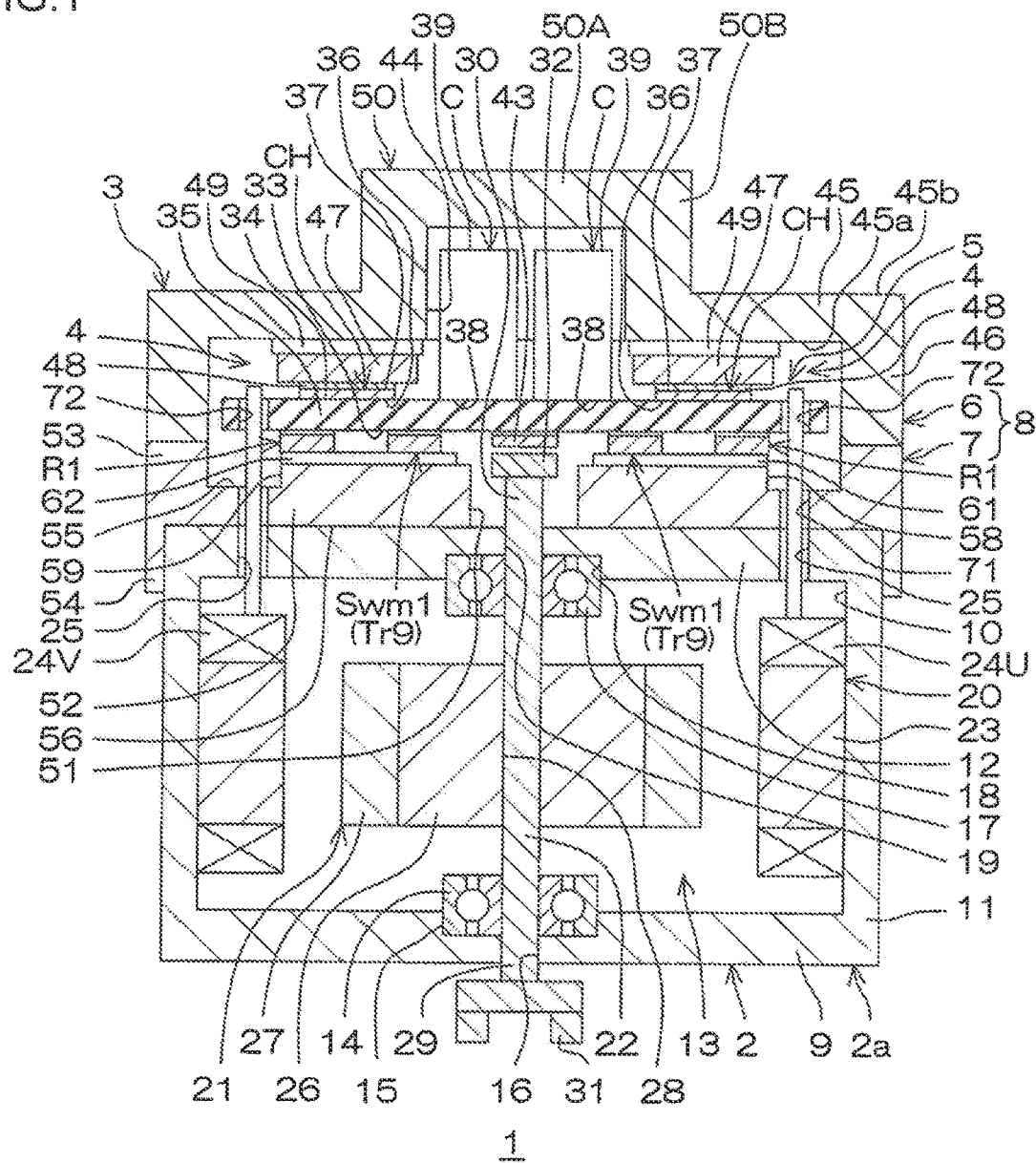
FIG. 1 is a sectional view of an electromechanical motor unit according to an embodiment of the invention.
Figure 2:
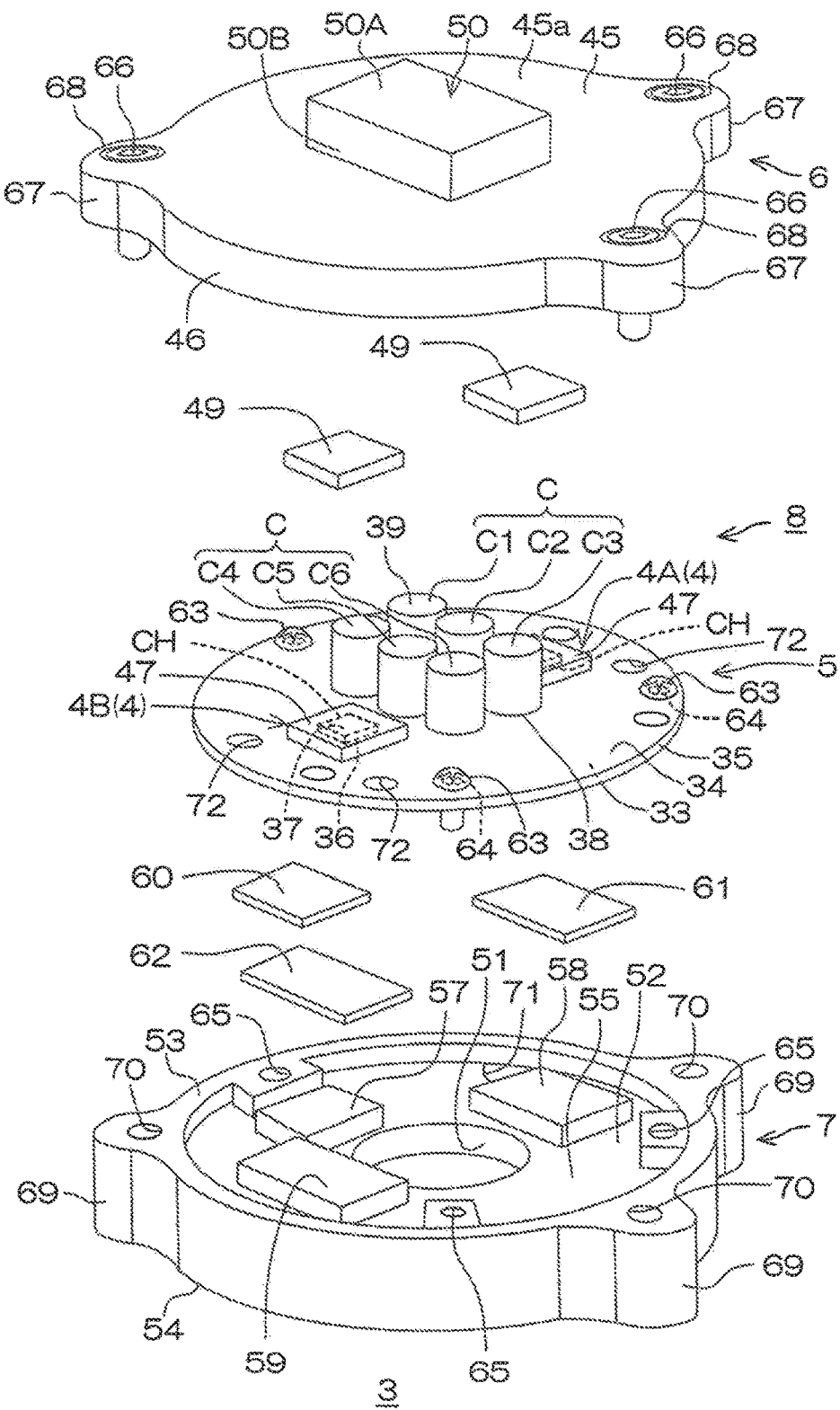
FIG. 2 is an exploded perspective view of a housing for a driving unit illustrated in FIG. 1 as viewed from above.
Figure 3:
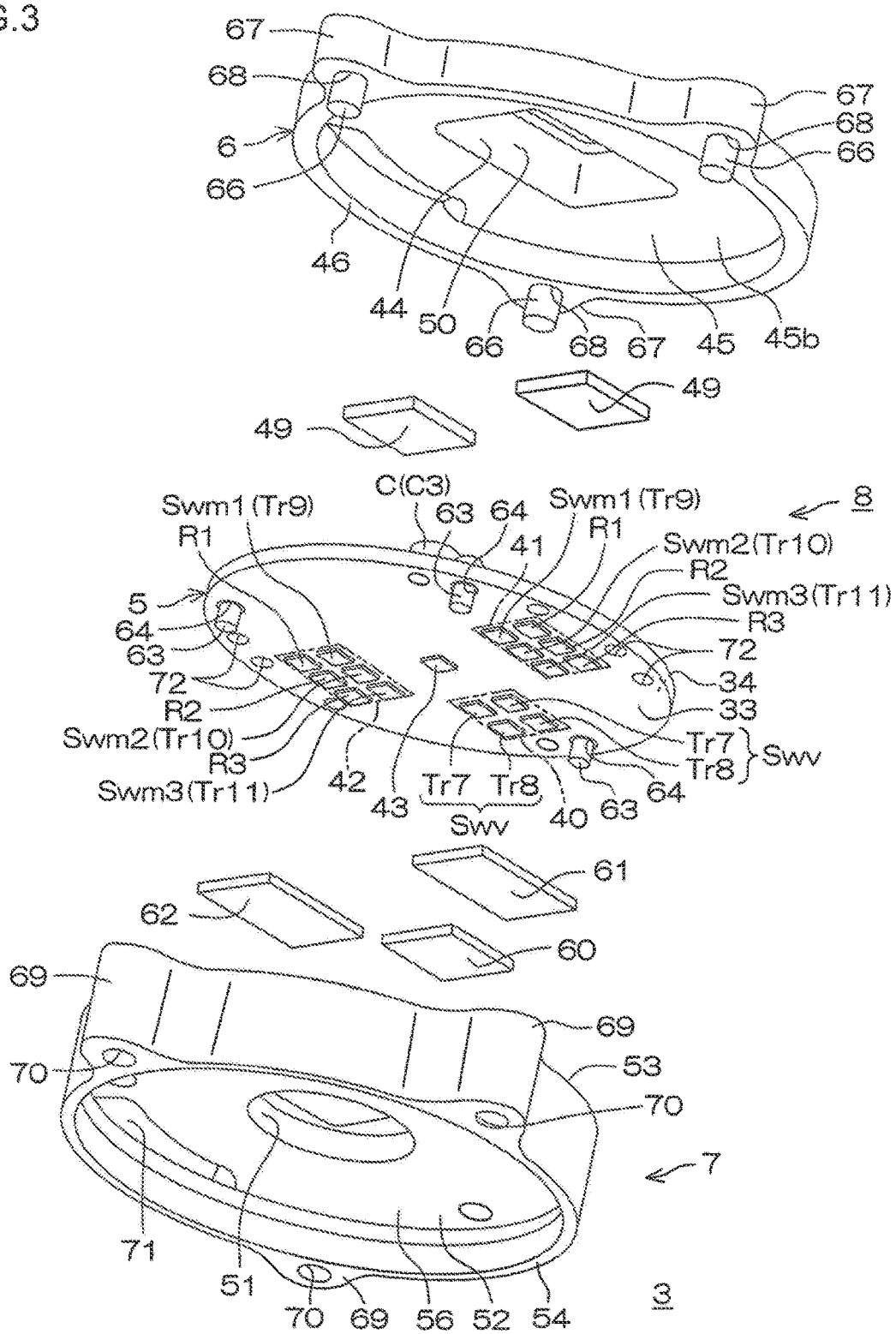
FIG. 3 is an exploded perspective view of the housing for the driving unit illustrated in FIG. 2 as viewed from below.

Hereinafter, example embodiments of the invention will be described in detail with reference to the accompanying drawings. FIG. 1 is a sectional view of an electromechanical motor unit 1 according to an embodiment of the invention. FIG. 2 is an exploded perspective view of a housing 8 for a driving unit 5 illustrated in FIG. 1 as viewed from above. FIG. 3 is an exploded perspective view of the housing 8 for the driving unit 5 illustrated in FIG. 2 as viewed from below. The electromechanical motor unit 1 according to the present embodiment is incorporated into, for example, an electric power steering system for a vehicle. The electromechanical motor unit 1 includes a motor 2 and a motor control device 3. The motor 2 includes a motor housing 2a made of metal. The motor control device 3 is disposed outside the motor housing 2a so as to face the motor 2 in the axial direction of the motor 2. In the present embodiment, the motor 2 is a three-phase brushless motor. The motor control device 3 includes the driving wilt 5, a cover member 6 made of metal, and a radiator 7 made of metal. The driving unit 5 includes driving circuits 4 configured to execute drive control of the motor 2. The cover member 6 accommodates the driving unit 5. The radiator 7 is disposed between the motor housing 2a and the driving unit 5.

In the present embodiment, the radiator 7 is connected to the cover member 6, whereby the radiator 7 and the cover member 6 constitute the housing 8 configured to accommodate the driving unit 5. Thus, the electromechanical motor unit 1 according to the present embodiment has a configuration in which the motor housing 2a and the housing 8 that accommodates the driving unit 5 are connected to each other in the axial direction of the motor 2.

The motor housing 2a has a bottom wall 9 having a disk shape, a sidewall 11 having a cylindrical shape, and an upper wall 12. The sidewall 11 extends from a peripheral edge of the bottom wall 9 in the axial direction. The sidewall 11 has an opening portion 10 located on the opposite side of the sidewall 11 from the bottom wall 9. The upper wall 12 is connected to an end portion of the sidewall 11 so as to close the opening portion 10. An internal space 13 is defined by the bottom wall 9, the sidewall 11 and the upper wall 12. In the internal space 13 of the motor housing 2a, a first bearing holding portion 15 configured to hold a first bearing 14 is provided in a central portion of the bottom wall 9. In the present embodiment, the first bearing holding portion 15 is a recessed portion that is recessed by one step in a generally circular shape. The first bearing 14 is disposed in the first bearing holding portion 15. A first through-hole 16 passing through the bottom wall 9 is provided in a bottom central portion of the first bearing holding portion 15.

In the internal space 13 of the motor housing 2a, a second bearing holding portion 18 configured to hold a second bearing 17 is provided in a central portion of the upper wall 12. In the present embodiment, the second bearing holding portion 18 is a recessed portion that is recessed by one step in a generally circular shape. The second bearing 17 is disposed in the second bearing holding portion 18. A second through-hole 19 passing through the upper wall 12 is provided in a bottom central portion of the second bearing holding portion 18.

A stator 20 having a cylindrical shape, a rotor 21 and a motor shaft 22 are disposed in the internal space 13 of the motor housing 2a. The rotor 21 is disposed radially inward of the stator 20. The motor shaft 22 is attached to the rotor 21 to pass through a central portion of the rotor 21. The stator 20 is fixed to an inner peripheral surface of the sidewall 11 of the motor housing 2a. The stator 20 includes a plurality of stator teeth 23, and coils 24U, 24V, 24W wound around the stator teeth 23. The stator teeth 23 extend radially inward from the inner peripheral surface of the sidewall 11 of the motor housing 2a. As described in detail with reference to FIG. 4, the coils 24U, 24V, 24W include a U-phase coil 24U, a V-phase coil 24V, and a W-phase coil 24W corresponding respectively to the LT-phase, the V-phase and the W-phase of the motor 2. Note that, in FIG. 1, among the U-phase coil 24U, the V-phase coil 24V, and the W-phase coil 24W, the U-phase coil 24U and the V-phase coil 24V are illustrated. One ends of the U-phase coil 24U, the V-phase coil 24V, and the W-phase coil 24W are drawn toward the driving unit 5 through first coil insertion holes 25 that are provided as appropriate in the upper wall 12 of the motor housing 2a.

The rotor 21 includes a rotor core 26 having a columnar shape, and a permanent magnet 27 having a ring-shape and fixed to an outer periphery of the rotor core 26. The permanent magnet 27 has south poles and north poles that are alternately magnetized in the circumferential direction of the rotor core 26. As viewed in the axial direction, a shaft insertion hole 28 through which the motor shaft 22 is inserted is provided in a central portion of the rotor core 26. The motor shaft 22 is inserted through the shaft insertion hole 28 provided in the rotor core 26 to be fixed in the shaft insertion hole 28. The motor shaft 22 is rotatably supported by the first bearing 14 provided on the bottom wall 9 of the motor housing 2a and the second bearing 17 provided on the upper wall 12 of the motor housing 2a. The rotor 21 is rotatably supported by the motor shaft 22 in the motor housing 2a.

The motor shaft 22 has a distal end portion 29 and a base end portion 30. The distal end portion 29 protrudes to the outside of the motor housing 2a through the first through-hole 16 provided in the bottom wall 9. The base end portion 30 protrudes to the outside of the motor housing 2a through the second through-hole 19 provided in the upper wall 12. A connecting member 31 is attached to the distal end portion 29 of the motor shaft 22. The connecting member 31 is connected to an external mechanism to transmit a rotary driving force generated by the motor 2 to the external mechanism. Examples of the external mechanism include a speed reducer for an electric power steering system. A permanent magnet 32 for detecting a rotation angle of the motor 2 is attached to the base end portion 30 of the motor shaft 22.

Figure 4:
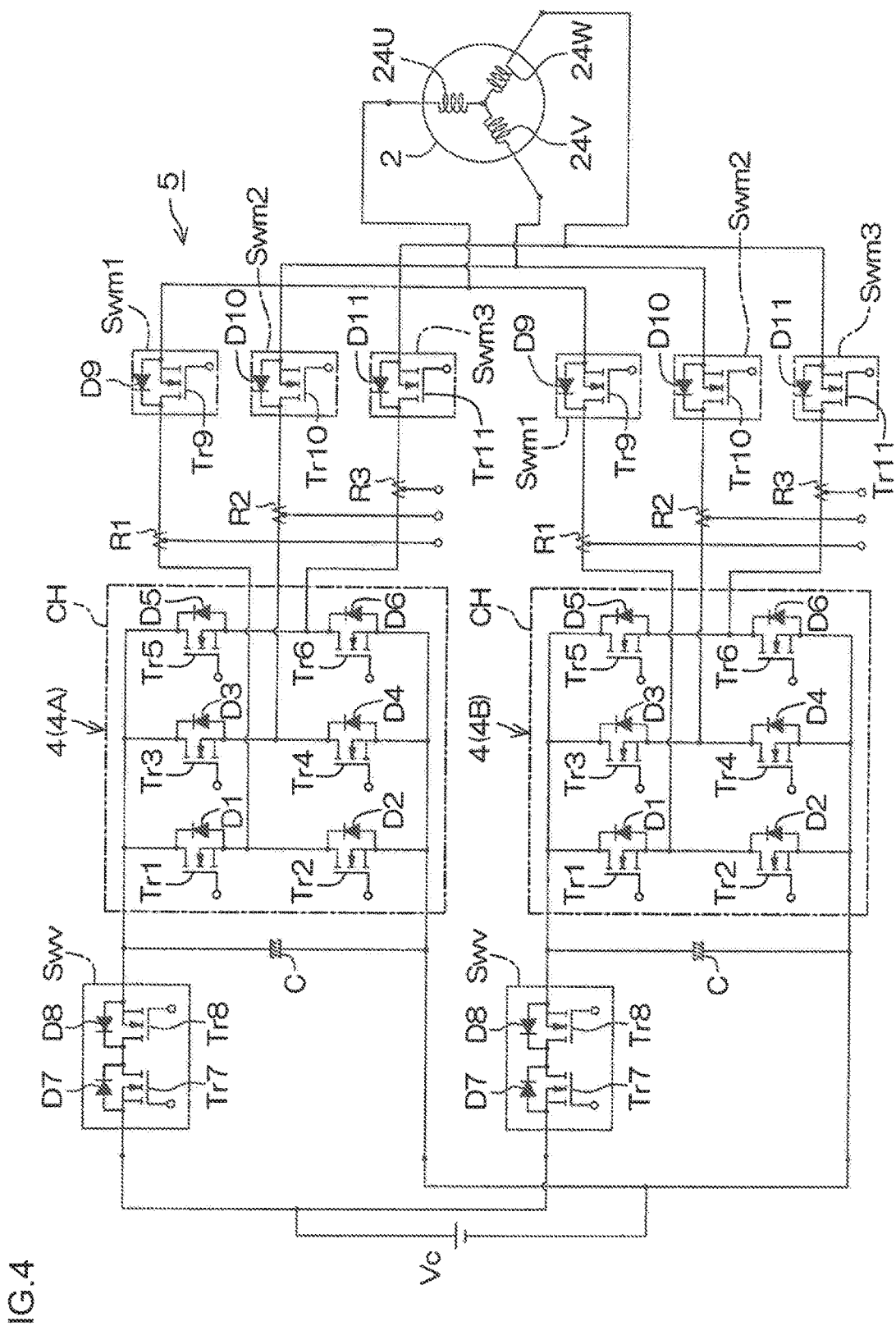
FIG. 4 is an electric circuit diagram illustrating the electrical configuration of the driving unit.

The driving unit 5 including the driving circuits 4 includes a substrate 35 having disk-shape. The substrate 35 has a first main surface 33 facing the motor housing 2a in the axial direction, and a second main surface 34 that is on the opposite side of the substrate 35 from the first main surface 33. The substrate 35 is, for example, a multi-layered wiring substrate. The substrate 35 includes a plurality of insulating layers, a plurality of wiring layers, and a via hole. The via hole electrically connects together the wiring layers respectively disposed above and below with the insulating layer interposed therebetween. Conductive traces are routed as appropriate on the first main surface 33 and the second main surface 34 of the substrate 35, and a plurality of electronic components that constitute each driving circuit 4 can be joined to both of the first main surface 33 and the second main surface 34 of the substrate 35. Hereinafter, the electrical configuration of the driving unit 5 will be described with reference to FIG. 4. FIG. 4 is an electric circuit diagram illustrating the electrical configuration of the driving unit 5.

As illustrated in FIG. 4, in the present embodiment, the driving unit 5 includes the driving circuits 4 for two systems that are connected in parallel to a power supply Vc. Hereinafter, one of the driving circuits 4 for the two systems (the driving circuit 4 on the upper side in FIG. 4) will be referred to as "first driving circuit 4A", and the other one of the driving circuits 4 for the two systems (the driving circuit 4 on the lower side in FIG. 4) will be referred to as "second driving circuit 4B". The first driving circuit 4A and the second driving circuit 4B have the same configuration. The configuration of the first driving circuit 4A will be described with reference to FIG. 4, and the elements of the second driving circuit 4B corresponding to those of the first driving circuit 4A will be denoted by the same reference symbols as those in the configuration of the first driving circuit 4A and description thereof will be omitted.

The first driving circuit 4A includes a semiconductor chip CH, a smoothing capacitor C, a power supply relay Swv, a plurality of shunt resistors R1 to R3, and a plurality of motor relays Swm1 to Swm3, which are a plurality of electronic components that constitute a part of the first driving circuit 4A. The semiconductor chip CH includes a plurality of field effect transistors (FETs) Tr1 to Tr6 serving as an example of the plurality of switching devices.

The semiconductor chip CR is connected to both electrodes of the power supply Vc. The field effect transistors Tr1 to Tr6 included in the semiconductor chip CH include the first field effect transistor Tr1 on the high side for the U-phase, the second field effect transistor Tr2 on the low side for the U-phase, which is connected in series to the first field effect transistor Tr1, the third field effect transistor Tr3 on the high side for the V-phase, the fourth field effect transistor Tr4 on the low side for the V-phase, which is connected in series to the third field effect transistor Tr3, the fifth field effect transistor Tr5 on the high side for the W-phase, and the sixth field effect transistor Tr6 on the low side for the W-phase, which is connected in series to the fifth field effect transistor Tr5.

Each of the field effect transistors Tr1 to Tr6 includes a drain electrode, a source electrode, and a gate electrode. In each of the field effect transistors Tr1 to Tr6, a corresponding one of body diodes D1 to D6 is connected to the drain electrode and the source electrode in a reversely biased manner. The drain electrodes of the first, third, and fifth field effect transistors Tr1, Tr3, Tr5 are connected to a positive electrode of the power supply Vc. The source electrodes of the first, third, and fifth field effect transistors Tr1, Tr3, Tr5 are respectively connected to the drain electrodes of the second, fourth, and sixth field effect transistors Tr2, Tr4, Tr6. The source electrodes of the second, fourth, and sixth field effect transistors Tr2, Tr4, Tr6 are connected to a negative electrode of the power supply Vc.

A connecting point between the first field effect transistor Tr1 and the second field effect transistor Tr2 is electrically connected to the U-phase coil 24U of the motor 2. A connecting point between the third field effect transistor Tr3 and the fourth field effect transistor Tr4 is electrically connected to the V-phase coil 24V of the motor 2. A connecting point between the fifth field effect transistor Tr5 and the sixth field effect transistor Tr6 is electrically connected to the W-phase coil 24W of the motor 2.

The smoothing capacitor C is connected to both of the electrodes of the power supply Vc so as to be connected in parallel to the semiconductor chip CH. The smoothing capacitor C smooths a voltage supplied from the power supply Vc, and then supplies the smoothed voltage to the semiconductor chip CH (the field effect transistors Tr1 to Tr6 included in the semiconductor chip CH). In the present embodiment, the first driving circuit 4A includes three smoothing capacitors C as described later. However, in FIG. 4, only one of the smoothing capacitors C is illustrated for the convenience of description.

The smoothing capacitor C is connected to the power supply Vc via the power supply relay Swv. In the present embodiment, the power supply relay Swv is constituted by a seventh field effect transistor Tr7 and an eighth field effect transistor Tr8. Each of the field effect transistors Tr7, Tr8 includes a drain electrode, a source electrode, and a gate electrode. In each of the field effect transistors Tr7, Tr8, a corresponding one of body diodes D7, D8 is connected to the drain electrode and the source electrode in a reversely biased manner.

In the power supply relay Swv, the field effect transistors Tr7, Tr8 are connected in series in such a manner that polar directions of the body diodes D7, D8 are opposite directions. In the present embodiment, the drain electrodes of the field effect transistors Tr7, Tr8 are connected to each other such that cathodes of the body diodes D7, D8 are connected to each other. The shunt resistors R1 to R3 are devices configured to individually detect currents flowing into the U-phase coil 24U, the V-phase coil 24V, and the W-phase coil 24W. The shunt resistors R1 to R3 include a first shunt resistor R1, a second shunt resistor R2, and a third shunt resistor R3. The U-phase coil 24U is connected via the first shunt resistor R1 to the connecting point between the first and second field effect transistors Tr1, Tr2. The V-phase coil 24V is connected via the second shunt resistor R2 to the connecting point between the third and fourth field effect transistors Tr3, Tr4. The W-phase coil 24W is connected via the third shunt resistor R3 to the connecting point between the fifth and sixth field effect transistors Tr5, Tr6.

The motor relays Swm1 to Swm3 include a first motor relay Swm1, a second motor relay Swm2, and a third motor relay Swm3. The U-phase coil 24U is connected via the first motor relay Swm1 to the first shunt resistor R1. The V-phase coil 24V is connected via the second motor relay Swm2 to the second shunt resistor R2. The W-phase coil 24W is connected via the third motor relay Swm3 to the third shunt resistor R3. In the present embodiment, the motor relays Swm1 to Swm3 are respectively constituted by ninth to eleventh field effect transistors Tr9 to Tr11. Each of the motor relays Swm1 to Swm3 includes a drain electrode, a source electrode, and a gate electrode. In each of the field effect transistors Tr9 to Tr11, a corresponding one of body diodes D9 to D11 is connected to the drain electrode and the source electrode in a reversely biased manner.

The gate electrodes of the field effect transistors Tr1 to Tr11 and the shunt resistors R1 to R3 may be connected, as controlled objects, to, for example, a microcomputer (not illustrated) joined to the first main surface 33 or the second main surface 34 of the substrate 35. As illustrated in FIG. 1 to FIG. 3, in the present embodiment, each of the semiconductor chips CH for the first and second driving circuits 4A, 4B has a rectangular parallelepiped shape, and is joined to the second main surface 34 of the substrate 35. Each of the semiconductor chips CH for the first and second driving circuits 4A, 4B has a first end portion 36 and a second end portion 37. The first end portion 36 faces the second main surface 34 of the substrate 35 in the axial direction. The second end portion 37 is on the opposite side of the semiconductor chip CH from the first end portion 36.

In the present embodiment, each of the semiconductor chips CH is a so-called horizontal semiconductor chip in which the source electrodes, the drain electrodes, and the gate electrodes of the field effect transistors Tr1 to Tr6 are provided on the first end portion 36-side. Each of the semiconductor chips CH is joined to the substrate 35 when the electrodes provided on the first end portion 36-side are joined to the conductive traces provided on the second main surface 34 of the substrate 35 via a joint material made of metal (e.g., a solder). On the other hand, the second end portion 37 of each of the semiconductor chips CH is a non-electrode surface on which no electrodes are provided, and the second end portion 37 is defined by a semiconductor substrate that constitutes a main body of the semiconductor chip CH. The semiconductor substrate may be, for example, a Si substrate or a GaN substrate.

The smoothing capacitors C for the first and second driving circuits 4A, 4B are joined to the second main surface 34 of the substrate 35 so as to be disposed adjacent to the semiconductor chips CH. More specifically, in the present embodiment, the semiconductor chips CH are joined to the second main surface 34, at positions outward of the smoothing capacitors C in the radial direction extending from the axis of the motor 2. More specifically, the semiconductor chips CH are joined to a peripheral edge portion of the second main surface 34 of the substrate 35. The smoothing capacitors C are joined to a central portion of the second main surface 34 of the substrate 35.

In the present embodiment, three smoothing capacitors C for the first driving circuit 4A and three smoothing capacitors C for the second driving circuit 4B are joined to the central portion of the second main surface 34 of the substrate 35. As viewed in the axial direction, the smoothing capacitors C for the first and second driving circuits 4A, 4B are joined to the central portion of the second main surface 34 of the substrate 35, in a prescribed matrix connecting manner. In FIG. 2, the three smoothing capacitors C for the first driving circuit 4A are denoted by reference symbols "C1 to C3", and the three smoothing capacitors C for the second driving circuit 4B are denoted by reference symbols "C4 to C6". In each of the first and second driving circuits 4A, 4B, the number of smoothing capacitors C may be varied as appropriate based on, for example, a capacitance value of the smoothing capacitor C and a voltage value required to drive the motor 2, that is, and the number of smoothing capacitors C is not limited to three.

Each of the smoothing capacitors C for the first and second driving circuits 4A, 4B is a columnar electrolytic capacitor having a height greater than that of the semiconductor chip CH, in the present embodiment. Each of the smoothing capacitors C has a third end portion 38 and a fourth end portion 39. The third end portion 38 faces the second main surface 34 of the substrate 35 in the axial direction. The fourth end portion 39 is on the opposite side of the smoothing capacitor C from the third end portion 38. The fourth end portion 39 of each of the smoothing capacitors C for the first and second driving circuits 4A, 4B is at a position further away, in the axial direction, from the second main surface 34 of the substrate 35 than the second end portion 37 of each of the semiconductor chips CH is, Each of the smoothing capacitors C is joined to the substrate 35 when the electrodes provided on the third end portion 38-side are joined to the conductive traces provided on the second main surface 34 of the substrate 35 via a joint material made of metal (e.g., a solder).

As illustrated in FIG. 3, a first joined region 40 is defined in a peripheral edge portion of the first main surface 33 of the substrate 35. In the first joined region 40, the seventh and eighth field effect transistors Tr7, Tr8 that constitute the power supply relay Swv of the first driving circuit 4A and the seventh and eighth field effect transistors Tr7, Tr8 that constitute the power supply relay Swv of the second driving circuit 4B are collectively joined to the first main surface 33 in a prescribed connecting manner.

A second joined region 41 is defined in a peripheral edge portion of the first main surface 33 of the substrate 35. In the second joined region 41, the shunt resistors R1 to R3 for the first driving circuit 4A and the motor relays Swm1 to Swm3 (the ninth to eleventh field effect transistors Tr9 to Tr11) for the first driving circuit 4A are collectively joined to the first main surface 33 in a prescribed connecting manner. In the present embodiment, the second joined region 41 is provided at a position that is offset by about 90 degrees from the first joined region 40 toward one side in the circumferential direction of the substrate 35.

A third joined region 42 is defined in a peripheral edge portion of the first main surface 33 of the substrate 35. In the third joined region 42, the shunt resistors R1 to R3 for the second driving circuit 4B and the motor relays Swm1 to Swm3 (the ninth to eleventh field effect transistors Tr9 to Tr11) for the second driving circuit 4B are collectively joined to the first main surface 33 in a prescribed connecting manner. In the present embodiment, the third joined region 42 is provided at a position that is offset by about 90 degrees from the first joined region 40 toward the other side in the circumferential direction of the substrate 35.

Further, a magnetic sensor 43 is joined to the central portion of the first main surface 33 of the substrate 35 in a prescribed connecting manner such that the magnetic sensor 43 is apart from the joined regions 40, 41, 42. The magnetic sensor 43 is joined to the central portion of the first main surface 33, at a position at which the magnetic sensor 43 faces the permanent magnet 32 attached to the base end portion 30 of the motor shaft 22. The magnetic sensor 43 detects a magnetic field (a magnetic flux) from the permanent magnet 32, which varies as the motor shaft 22 rotates.

As illustrated in FIG. 1 to FIG. 3, the cover member 6 faces the second main surface 34 of the substrate 35 in the axial direction. The cover member 6 includes a bottom wall portion 45 (an example of "facing wall") having a disk shape, a sidewall portion 46 (an example of "connection portion") having a cylindrical shape, and a closing portion 50 (an example of "closing member"). A rectangular through-hole 44 through which the smoothing capacitors C pass is provided in a central portion of the bottom wall portion 45. At a position outside the substrate 35, the sidewall portion 46 extends from an outer peripheral edge of the bottom wall portion 45 toward the motor housing 2a. The closing portion 50 closes the through-hole 44 so as to cover the smoothing capacitors C.

The bottom wall portion 45 of the cover member 6 is disposed so as to face the smoothing capacitors C in a direction perpendicular to the axial direction. More specifically, the bottom wall portion 45 of the cover member 6 has an inner wall surface 45a facing the second main surface 34 of the substrate 35, and an outer wall surface 45b on the opposite side of the bottom wall portion 45 from the inner wall surface 45a. The bottom wall portion 45 is configured such that at least the inner wall surface 45a is positioned between the third end portion 38 and the fourth end portion 39 of each of the smoothing capacitors C in the axial direction. In the present embodiment, the bottom wall portion 45 of the cover member 6 is configured such that both of the inner wall surface 45a and the outer wall surface 45b are positioned between the third end portion 38 and the fourth end portion 39 of each of the smoothing capacitors C in the axial direction. The bottom wall portion 45 of the cover member 6 is thermally connected to each of the semiconductor chips CH for the first and second driving circuits 4A, 4B, at a position between the third end portion 38 and the fourth end portion 39 of each of the smoothing capacitors C in the axial direction.

In the present embodiment, a heat spreader 47 having a plate shape or a block shape and made of metal (e.g., copper) is joined to the second end portion 37 of each of the semiconductor chips CH for the first and second driving circuits 4A, 4B, via a joint material 48 made of metal (e.g., a solder). The bottom wall portion 45 of the cover member 6 is thermally connected to the heat spreaders 47 via first radiating sheets 49 containing, for example, silicone, metal, or ceramic. In this way, the bottom wall portion 45 of the cover member 6 is thermally connected to the semiconductor chips CH for the first and second driving circuits 4A, 4B.

The sidewall portion 46 of the cover member 6 is connected to the radiator 7, and is thermally connected to the motor housing 2a via the radiator 7. Thus, the heat generated in the semiconductor chips CH is transmitted to the motor housing 2a via the joint materials 48, the heat spreaders 47, the first radiating sheets 49, and the cover member 6. Instead of the first radiating sheets 49, thermal grease containing silicone, metal or ceramic may be employed, or metal paste containing silicone, metal or ceramic may be employed.

The closing portion 50 of the cover member 6 includes a bottom wall portion 50A having a rectangular shape in a plan view, and a sidewall portion 50B having a rectangular-tube shape. The sidewall portion 50B extends from an outer peripheral edge of the bottom wall portion 50A toward the motor housing 2a, and connects the bottom wall portion 50A to an inner edge portion of the bottom wall portion 45 that defines the through-hole 44. In the present embodiment, the closing portion 50 is integral with the bottom wall portion 45 of the cover member 6. Alternatively, the closing portion 50 may be prepared separately from the cover member 6.

The radiator 7 disposed between the motor housing 2a and the driving unit 5 provides thermal connection between the motor housing 2a and each of the shunt resistors R1 to R3, each of the power supply relays Swv (the seventh and eighth field effect transistors Tr7, Tr8), and each of the motor relays Swm1 to Swm3 (the ninth to eleventh field effect transistors Tr9 to Tr11), at a position between the upper wall 12 of the motor housing 2a and the first main surface 33 of the substrate 35.

More specifically, the radiator 7 has a plate portion 52 having a disk shape, a first cylindrical portion 53, and a second cylindrical portion 54, as illustrated in FIG. 2 and FIG. 3. The plate portion 52 has a through-hole 51 provided in a central portion thereof. The base end portion 30 of the motor shaft 22 passes through the through-hole 51. The first cylindrical portion 53 extends from a peripheral edge of the plate portion 52 toward the driving unit 5 in the axial direction. The second cylindrical portion 54 extends from the peripheral edge of the plate portion 52 toward the motor housing 2a in the axial direction. The first cylindrical portion 53 and the second cylindrical portion 54 of the radiator 7 constitute an outer wall of the radiator 7.

The plate portion 52 of the radiator 7 includes a facing surface 55 facing the first main surface 33 of the substrate 35, and a non-facing surface 56 that is on the opposite side of the plate portion 52 from the facing surface 55. The plate portion 52 of the radiator 7 has a first protrusion 57, a second protrusion 58, and a third protrusion 59 that are provided on the facing surface 55. The first protrusion 57 protrudes toward the first joined region 40 of the first main surface 33 of the substrate 35. The second protrusion 58 protrudes toward the second joined region 41 of the first main surface 33 of the substrate 35. The third protrusion 59 protrudes toward the third joined region 42 of the first main surface 33 of the substrate 35. In the present embodiment, each of the first to third protrusions 57, 58, 59 has a rectangular shape as viewed in the axial direction.

The first protrusion 57 of the plate portion 52 faces the seventh and eighth field effect transistors Tr7, Tr8 that constitute the power supply relays Swv of the first and second driving circuits 4A, 4B. For example, the first protrusion 57 is thermally connected to the seventh and eighth field effect transistors Tr7, Tr8 via a second radiating sheet 60 containing silicone, metal or ceramic. Instead of the second radiating sheet 60, thermal grease containing silicone, metal or ceramic may be employed, or metal paste containing silicone, metal or ceramic may be employed.

The second protrusion 58 of the plate portion 52 faces the shunt resistors R1 to R3 of the first driving circuit 4A and the motor relays Swm1 to Swm3 (the ninth to eleventh field effect transistors Tr9 to Tr11) of the first driving circuit 4A. For example, the second protrusion 58 is thermally connected to the shunt resistors R1 to R3 and the motor relays Swm1 to Swm3 of the first driving circuit 4A via a third radiating sheet 61 containing silicone, metal or ceramic. Instead of the third radiating sheet 61, thermal grease containing silicone, metal or ceramic may be employed, or metal paste containing silicone, metal or ceramic may be employed.

The third protrusion 59 of the plate portion 52 faces the shunt resistors R1 to R3 of the second driving circuit 4B and the motor relays Swm1 to Swm3 (the ninth to eleventh field effect transistors Tr9 to T11) of the second driving circuit 4B. For example, the third protrusion 59 is thermally connected to the shunt resistors R1 to R3 and the motor relays Swm1 to Swm3 of the second driving circuit 4B via a fourth radiating sheet 62 containing silicone, metal or ceramic. Instead of the fourth radiating sheet 62, thermal grease containing silicone, metal or ceramic may be employed, or metal paste containing silicone, metal or ceramic may be employed.

As illustrated in FIG. 2, the substrate 35 is fixed to the plate portion 52 of the radiator 7 with first bolts 63. More specifically, a plurality of (in the present embodiment, three) first bolt insertion holes 64 is provided in the peripheral edge portion of the substrate 35. The first bolt insertion holes 64 are arranged in the circumferential direction of the substrate 35. In addition, second bolt insertion holes 65 are provided in the peripheral edge portion of the plate portion 52 of the radiator 7, at such positions that the second bolt insertion holes 65 are aligned with the first bolt insertion holes 64. The first bolts 63 are inserted through the first bolt insertion holes 64 and the corresponding second bolt insertion holes 65 from the substrate 35-side toward the radiator 7-side. In this way, the substrate 35 is fixed to the radiator 7.

The cover member 6 is fixed to the first cylindrical portion 53 of the radiator 7 with second bolts 66. More specifically, the sidewall portion 46 of the cover member 6 is provided with a plurality of (in the present embodiment, three) first extending portions 67 extending outward in the radial direction of the cover member 6. Third bolt insertion holes 68 are provided in the first extending portions 67. In addition, an outer wall constituted by the first cylindrical portion 53 and the second cylindrical portion 54 of the radiator 7 is provided with second extending portions 69 extending outward in the radial direction of the radiator 7. The second extending portions 69 are provided at such positions that the second extending portions 69 are aligned with the first extending portions 67. Fourth bolt insertion holes 70 are provided in the second extending portions 69, at such positions that the fourth bolt insertion holes 70 are aligned with the third bolt insertion holes 68.

The second bolts 66 are inserted through the third bolt insertion holes 68 and the corresponding fourth bolt insertion holes 70 from the cover member 6-side toward the radiator 7-side. In this way, the cover member 6 is fixed to the radiator 7, so that the housing 8 for the driving unit 5 is constituted by the cover member 6 and the radiator 7. The second cylindrical portion 54 of the radiator 7 is externally fitted to the motor housing 2a. In this way, the radiator 7 is attached to the motor housing 2a. The radiator 7 is configured such that the non-facing surface 56 of the plate portion 52 comes in contact with the upper wall 12 of the motor housing 2a when the radiator 7 is attached to the motor housing 2a. As a result, the radiator 7 and the motor housing 2a are mechanically and thermally connected to each other. In addition, the cover member 6 is mechanically and thermally connected to the motor housing 2a via the radiator 7.

Referring to FIG. 1 again, second coil insertion holes 71 through which the one ends of the U-phase coil 24U, the V-phase coil 24V, and the NV-phase coil 24W are inserted are provided as appropriate in the plate portion 52 of the radiator 7. The one ends of the U-phase coil 24U, the V-phase coil 24V, and the W-phase coil 24W are drawn toward the driving unit 5 through the second coil insertion holes 71 provided in the plate portion 52. Third coil insertion holes 72 through which the one ends of the U-phase coil 24U, the V-phase coil 24V, and the W-phase coil 24W are inserted are provided as appropriate in the peripheral edge portion of the substrate 35. The one ends of the U-phase coil 24U, the V-phase coil 24V, and the W-phase coil 24W are drawn to the second main surface 34 of the substrate 35 through the third coil insertion holes 72 provided in the peripheral edge portion of the substrate 35. The one ends of the U-phase coil 24U, the V-phase coil 24V, and the W-phase coil 24W are electrically connected to the first and second driving circuits 4A, 4B, on the first main surface 33-side or the second main surface 34-side of the substrate 35.

As described above, in the electromechanical motor unit 1 according to the present embodiment, the semiconductor chips CH and the smoothing capacitors C are joined to the second main surface 34 of the substrate 35 having the first main surface 33 that faces the motor housing 2a and the second main surface 34 that is on the opposite side of the substrate 35 from the first main surface 33. Each semiconductor chip CH includes the first end portion 36 facing the second main surface 34 of the substrate 35 and the second end portion 37 that is on the opposite side of the semiconductor chip CH from the first end portion 36. Each smoothing capacitor C includes the third end portion 38 facing the second main surface 34 of the substrate 35 and the fourth end portion 39 that is on the opposite side of the smoothing capacitor C from the third end portion 38.

The bottom wall portion 45 of the cover member 6 is disposed so as to face the smoothing capacitors C in the direction perpendicular to the axial direction. The bottom wall portion 45 is thermally connected to each semiconductor chip CH at a position that is closer to the second main surface 34 of the substrate 35 than the fourth end portion 39 of the smoothing capacitor C is. The cover member 6 includes the sidewall portion 46 that thermally connects the bottom wall portion 45 to the motor housing 2a. In this way, the semiconductor chips CH are thermally connected to the motor housing 2a via the cover member 6.

As a result, in the configuration in which the semiconductor chips CH and the smoothing capacitors C are joined to the second main surface 34 of the substrate 35, it is possible to appropriately transfer the heat generated in the semiconductor chips CH to the motor housing 2a having a relatively high thermal capacity via the cover member 6 while reducing the length of a path through which the heat generated in the semiconductor chips CH is transferred to the motor housing 2a. In particular, in the electromechanical motor unit 1 according to the present embodiment, the semiconductor chips CH are joined to the peripheral edge portion of the second main surface 34 of the substrate 35, and the smoothing capacitors C are joined to the central portion of the second main surface 34 of the substrate 35. Thus, the length of the path through which the heat generated in the semiconductor chips CH is transferred to the motor housing 2a can be further reduced. Hence, the heat generated in the semiconductor chips CH can be appropriately transferred to the motor housing 2a, As a result, an increase in the temperature of the semiconductor chips CH can be appropriately suppressed. Consequently, it is possible to provide the electromechanical motor unit 1 configured to appropriately suppress an increase in the temperature in the driving unit 5.

In addition, in the electromechanical motor unit 1 according to the present embodiment, the radiator 7 is disposed between the motor housing 2a and the first main surface 33 of the substrate 35, and the radiator 7 provides thermal connection between the motor housing 2a and each of the power supply relays Swv (the seventh and eighth field effect transistors Tr7, Tr8), each of the shunt resistors R1 to R3, and each of the motor relays Swm1 to Swm3 (the ninth to eleventh field effect transistors Tr9 to Tr11).

With this configuration, the heat generated in each of the power supply relays Swv (the seventh and eighth field effect transistors Tr7, Tr8), each of the shunt resistors R1 to R3, and each of the motor relays Swm1 to Swm3 (the ninth to eleventh field effect transistors Tr9 to Tr11) can be transferred to the motor housing 2a via the radiator 7. In addition, the heat generated in the semiconductor chips CH can also be transferred to the motor housing 2a via the radiator 7.

In the electromechanical motor unit 1 according to the present embodiment, the cover member 6 and the radiator 7 are mechanically and thermally connected to each other. Thus, the heat generated in the semiconductor chips CH can be appropriately transferred to the motor housing 2a via the cover member 6 and the radiator 7. As a result, an increase in the temperature in the driving unit 5 can be further suppressed. In the electromechanical motor unit 1 according to the present embodiment, the through-hole 44 through which the smoothing capacitors C pass is provided in the bottom wall portion 45 of the cover member 6. With this configuration, regardless of the size and shape of the smoothing capacitor C, the bottom wall portion 45 of the cover member 6 can be disposed at a position between the third end portion 38 and the fourth end portion 39 of each smoothing capacitor C in the axial direction. In the electromechanical motor unit 1 according to the present embodiment, the closing portion 50 configured to close the through-hole 44 is provided on the bottom wall portion 45 of the cover member 6. With this configuration, the smoothing capacitors C protruding from the through-hole 44 can be appropriately protected.

In the electromechanical motor unit 1 according to the present embodiment, the semiconductor chips CH and the smoothing capacitors C are joined to the second main surface 34 of the substrate 35. Thus, as compared to the case where the semiconductor chips CH and the smoothing capacitors C are joined to different surfaces of the substrate 35 or the case where the semiconductor chips CH and the smoothing capacitors C are joined to different members, the wiring path between the semiconductor chips CH and the smoothing capacitors C can be shortened. Thus, the inductance components between the semiconductor chips CH and the smoothing capacitors C can be appropriately reduced.

In the electromechanical motor unit 1 according to the present embodiment, the semiconductor chips CH and the smoothing capacitors C are joined to the second main surface 34 of the substrate 35. In addition, a plurality of electronic components constituting a part of the first and second driving circuits 4A, 4B is joined to the first main surface 33 of the substrate 35. Since the first main surface 33-side region of the substrate 35 is used in this way, it is no longer necessary to use another substrate to which electronic components other than the semiconductor chips CH and the smoothing capacitors C are to be joined. Thus, the number of components can be reduced. Hence, reduction in the size of the electromethanical motor unit 1 can be achieved.

While one example embodiment of the invention has been described above, the invention may be implemented in various other embodiments. For example, in the foregoing embodiment, the driving unit includes the first and second driving circuits 4A, 4B for the two systems. However, the driving unit 5 may include only a driving circuit 4 for a single system.

In the foregoing embodiment, each semiconductor chip CH includes a plurality of the field effect transistors Tr1 to Tr6. However, a plurality of the semiconductor chips CH each including any one of the field effect transistors Tr1 to Tr6 may be joined to the second main surface 34 of the substrate 35. In the foregoing embodiment, each semiconductor chip CH includes the field effect transistors Tr1 to Tr6 as an example of a plurality of switching devices. However, each semiconductor chip CH may include insulated gate bipolar transistors (IGBTs) or bipolar junction transistors (BJTs), instead of the field effect transistors Tr1 to Tr6.

Instead of the first to third protrusions 57, 58, 59 provided on the plate portion 52 of the radiator 7 in the foregoing embodiment, heat spreaders having a block-shape or a plate-shape, made of metal (for example, copper), and prepared separately from the radiator 7 may be provided. In addition, various design changes may be made within the scope of the appended claims.

What is claimed is:
1. An electromechanical motor unit comprising:
a motor including a motor housing made of metal; and
a motor control device disposed outside the motor housing so as to face the motor in an axial direction of the motor, the motor control device including a driving unit including a driving circuit configured to execute drive control of the motor and a cover member made of metal and configured to accommodate the driving unit, wherein
the driving unit comprises:
a substrate having a first main surface facing the motor housing, and a second main surface that is on an opposite side of the substrate from the first main surface;
a semiconductor chip joined to the second main surface of the substrate, the semiconductor chip including a switching device constituting a part of the driving circuit, and the semiconductor chip having a first end portion facing the second main surface of the substrate in the axial direction and a second end portion that is on an opposite side of the semiconductor chip from the first end portion; and
a smoothing capacitor joined to the second main surface of the substrate, the smoothing capacitor constituting a part of the driving circuit, the smoothing capacitor configured to smooth a voltage to be applied to the semiconductor chip, the smoothing capacitor having a third end portion facing the second main surface of the substrate in the axial direction and a fourth end portion that is on an opposite side of the smoothing capacitor from the third end portion, and the fourth end portion being at a position further away, in the axial direction, from the second main surface of the substrate than the second end portion of the semiconductor chip is, and
the cover member comprises:
a facing wall disposed so as to face the second main surface of the substrate in the axial direction and so as to face the smoothing capacitor in a direction perpendicular to the axial direction, and the facing wall being thermally connected to the semiconductor chip, at a position between the third end portion and the fourth end portion of the smoothing capacitor in the axial direction; and
a connection portion disposed outward of a peripheral edge of the substrate as viewed in the axial direction, the connection portion extending from a peripheral edge of the facing wall toward the motor housing, and the connection portion thermally connecting the facing wall and the motor housing to each other.

2. The electromechanical motor unit according to claim 1, further comprising:
a radiator made of metal, the radiator being disposed between the motor housing and the driving unit; and
a plurality of electronic components joined to the first main surface of the substrate, the electronic components constituting a part of the driving circuit, wherein
the radiator thermally connects the electronic components and the motor housing to each other, at a position between the motor housing and the first main surface of the substrate.

3. The electromechanical motor unit according to claim 2, wherein
when the radiator is connected to the cover member, the radiator and the cover member constitute a housing configured to accommodate the driving unit, and
the connection portion of the cover member is thermally connected to the motor housing via the radiator.

4. The electromechanical motor unit according to claim 1, wherein the semiconductor chip is joined to the second main surface of the substrate, at a position outward of the smoothing capacitor in a radial direction extending from an axis of the motor.

5. The electromechanical motor unit according to claim 2, wherein the semiconductor chip is joined to the second main surface of the substrate, at a position outward of the smoothing capacitor in a radial direction extending from an axis of the motor.

6. The electromechanical motor unit according to claim 3, wherein the semiconductor chip is joined to the second main surface of the substrate, at a position outward of the smoothing capacitor in a radial direction extending from an axis of the motor.

7. The electromechanical motor unit according to claim 1, wherein a through-hole through which the smoothing capacitor passes is provided in the facing wall of the cover member.

8. The electromechanical motor unit according to claim 2, wherein a through-hole through which the smoothing capacitor passes is provided in the facing wall of the cover member.

9. The electromechanical motor unit according to claim 3, wherein a through-hole through which the smoothing capacitor passes is provided in the facing wall of the cover member.

10. The electromechanical motor unit according to claim 7, further comprising a closing member configured to close the through-hole so as to cover the smoothing capacitor.

11. The electromechanical motor unit according to claim 8, further comprising a closing member configured to close the through-hole so as to cover the smoothing capacitor.

12. The electromechanical motor unit according to claim 9, further comprising a closing member configured to close the through-hole so as to cover the smoothing capacitor.

* * * * *